US008805909B2

(12) United States Patent
Hurley et al.

(10) Patent No.: US 8,805,909 B2
(45) Date of Patent: Aug. 12, 2014

(54) METHOD AND DEVICE FOR PERFECTLY INCOHERENT SAMPLING TO A HAAR DOMAIN

(75) Inventors: Paul T. Hurley, Zurich (CH); Tomas Tuma, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 645 days.

(21) Appl. No.: 13/096,500

(22) Filed: Apr. 28, 2011

(65) Prior Publication Data

US 2011/0270905 A1 Nov. 3, 2011

(30) Foreign Application Priority Data

Apr. 30, 2010 (EP) .................................... 10161652

(51) Int. Cl.
*G06F 17/14* (2006.01)
(52) U.S. Cl.
USPC .......................................................... 708/400
(58) Field of Classification Search
CPC ..... G06F 17/146; G06F 17/142; G06F 17/14; G06F 17/145; G06F 17/148
USPC ....................................................... 708/400
See application file for complete search history.

(56) References Cited

U.S. PATENT DOCUMENTS 4,055,756 A * 10/1977 Jolivet et al. .................. 708/400

OTHER PUBLICATIONS

E. J. Candes and M. Wakin: "An introduction to compressive sampling", IEEE Signal Processing Magazine, 25:Mar. 21-30, 2008.
T.Tuma, S. Rooney, P. Hurley: "On the applicability of compressive sampling for fine grained processor performance monitoring", ICECCS 2009, Potsdam, Germany.
R. Coifman, F. Geshwind and Y. Meyer, "Noiselets", Applied and Computational Harmonic Analysis, 10:27-44, 2001.
Thornton, et al: "Transformations Amongst the Walsh, Haar, Arithmetic and Reed-Muller Spectrum Domains", Int. Wrkshp on Appl of the Reed-Muller Expansion, Miss State, 2001.
Rao, et al. "Hadamard-Haar transform", Southeastern Sympsium on System Theory, 6th Annual, Jan. 1, 1974 p. 3PP.
K.R. Rao, et al., "Image Data Processing by Hadamard-Haar Transform", IEEE Transacations on Computers, vol. C-24, No. 9, Sep. 1, 1975.
Huang, DM Ed, Institute of Electrical and Electronics Engineers: "Walsh-Hadamard-Haar Hybrid Transforms", Proceedings of the international Joint Confernece on Pattern Recognition, Dec. 1-4, 1980.
Tomas Tuma, et al, "On the inchoerence of noiselet and Haar bases", Jan. 1, 2009 pp. 1-4.

* cited by examiner

*Primary Examiner* — Tan V. Mai
(74) *Attorney, Agent, or Firm* — Vazken Alexanian

(57) ABSTRACT

A method for converting a signal, including the steps of: providing a first representation of the signal in a first domain; converting the first representation of the signal into a second representation of the signal in a second domain, by applying a transform involving a Haar transform and a Hadamard transform, such that a basis of the second domain is maximally incoherent to a Haar basis. The signal is converted to a domain whose basis is maximally incoherent to a Haar basis. Yet, it is not required to convert the input vector representing the signal to a Haar basis first. This allows reducing the number of steps which increases conversion efficiency. Accordingly, obtaining the structure of the signal requires fewer samples.

8 Claims, 4 Drawing Sheets

METHOD AND DEVICE FOR PERFECTLY INCOHERENT SAMPLING TO A HAAR DOMAIN

CROSS-REFERENCE TO RELATED APPLICATION

This application claims priority under 35 U.S.C. §119 from European Patent Application No. 10161652.2 filed Apr. 30, 2010, the entire contents of which are incorporated herein by reference.

BACKGROUND OF THE INVENTION

1. Technical Field

The present invention relates to signal processing. More specifically, the invention relates to methods and systems for determining a representation of a signal.

2. Related Art

Compressive sampling is a method to simultaneously sample and compress a signal. Traditional methods for capturing and processing of signals firstly sample the signal and secondly compress the sampled data. According to the Nyquist criteria, in case the signal to be sampled is bandlimited, the sampling should be carried out above the Nyquist frequency, which is twice the frequency range of the signal. If the sampling is followed by compression, e.g. JPEG of image, a lot of redundant information is eliminated from the data sampled before.

It turned out that these two steps can be performed in one, thereby allowing obtaining compressed data with far less samples. As a result, it becomes possible to sample very high bandwidth signals or to obtain accuracy with fewer sensors. Applications for compressive sampling are widespread and include audio and image processing from the development of cameras, medical image devices and security scanners to new algorithms to record and sample audio and video. In all applications, a reduction of power consumption and/or an increase in efficiency can be obtained.

One of the core tenets of compressive sampling is the notion of incoherence. Two bases are said to be incoherent if signals with a sparse support in one are guaranteed to be spread out when expressed in the other. This property is crucial for compressive sampling. For a pair of given bases the incoherence can be measured quantitatively. The highest incoherent pair of bases has been shown to play a role in obtaining a high amount of information for few samples.

In E. J. Candès and M. Wakin: "An introduction to compressive sampling", IEEE Signal Processing Magazine, 25:21-30, March 2008, a method for compressive sampling is also described.

Therefore, there are situations which require constructing a pair of perfectly incoherent bases (a pair of bases with the highest incoherence between them).

Wavelets are well known in the field of harmonic analysis and signal processing. Apart from their fundamental significance they have been widely employed in various industry standard applications. For instance, the JPEG 2000 standard uses the Cohen-Daubechies-Feauveau wavelet transform to achieve image compression. Wavelets naturally appear as the sparsity basis in compressive sampling and are widely promoted. Hardware applications often favor the discrete Haar wavelet, which is computationally simple and the use of which results in comparable or even better performance than more sophisticated wavelets in lots of applications (see e.g. T. Tuma, S. Rooney, P. Hurley: "On the applicability of compressive sampling for fine grained processor performance monitoring", ICECCS 2009, Potsdam, Germany).

The present invention generally relates to compressive sampling which can be performed in a computationally efficient manner with a minimal amount of samples needed. In particular, the invention also relates to a fast algorithm which allows for transforming a signal into a domain which is perfectly incoherent with a Haar domain. This means that compressive sampling can be used with a Haar domain as the sparsity basis at its best performance.

Fast transforms are crucial for practicality of any sampling ensemble. It can be realized that one way to obtain the data in a domain perfectly incoherent with a Haar domain is to convert the data to a Haar domain and subsequently, apply a Hadamard transform. However, a straightforward implementation using the two transforms separately, explicitly results in twice as many computational stages as one can expect of a fast transform.

Other approaches to obtain a perfectly or maximally incoherent basis to a Haar basis are known, e.g. by R. Coifman, F. Geshwind and Y. Meyer, "Noiselets", *Applied and Computational Harmonic Analysis*, 10:27-44, 2001. Therein, a fast noiselet transform can be implemented based on the Cooley-Tukey design pattern. However, noiselets are complex by definition. This means that the transform algorithm and result inherently use and produce complex numbers. Without any other processing taken into account this means a double effort in software and in hardware, respectively, which is expensive in most of the application domains.

It is therefore an object of the present invention to provide a method for converting a signal using a fast and efficient algorithm which allows transforming a signal into a domain which is perfectly incoherent with a Haar domain, and which consists solely of real numbers.

SUMMARY OF THE INVENTION

One aspect of the present invention provides a method for converting a signal including the steps of: providing a first representation of the signal in a first domain and converting the first representation of the signal into a second representation of the signal in a second domain, by applying a transform involving a Haar transform and a Hadamard transform, such that a basis of the second domain is maximally incoherent to a Haar basis. The signal is converted to a domain whose basis is maximally incoherent to a Haar basis. Yet, it is not required to convert the input vector representing the signal to a Haar basis first. This allows reducing the number of steps which increases conversion efficiency. Accordingly, obtaining the structure of the signal requires less samples.

Another aspect of the present invention provides a device for converting a signal, containing stage-to-stage wiring and feed-forward wiring coupled with adders to achieve the computation of the transform.

Another aspect of the present invention provides a computer readable article of manufacture tangibly embodying computer readable instructions which when executed, causes a computer to carry out the steps of a method for converting a signal including the steps of: providing a first representation of the signal in a first domain; converting the first representation of the signal into a second representation of the signal in a second domain, by applying a transform involving a Haar transform and a Hadamard transform, such that a basis of the second domain is maximally incoherent to a Haar basis.

BRIEF DESCRIPTION OF THE DRAWINGS

The invention and its embodiments are described in more detail when taken in conjunction with the accompanying drawings, in which.

DETAILED DESCRIPTION OF THE PREFERRED EMBODIMENTS

Figure 1:
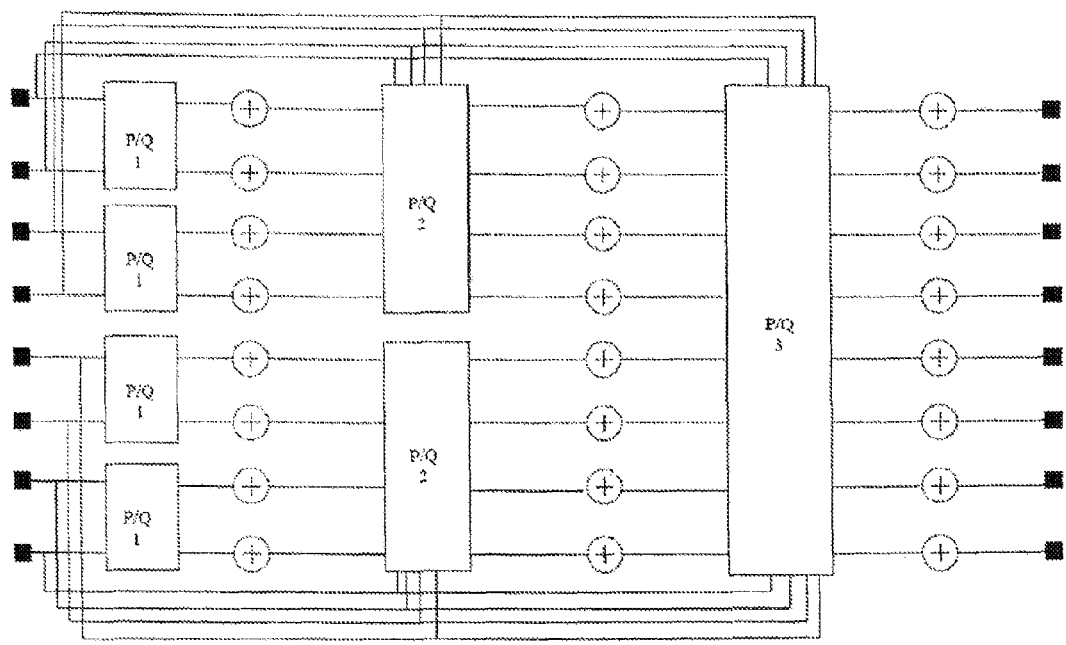
FIG. 1 shows a block diagram for performing a fast transform for perfectly incoherent sampling to a Haar domain for n=3 stages.

FIG. 1 shows a block diagram of a design for converting a first representation of a signal (or a measurement) from a first domain into a second representation in a second domain, by applying a transform involving a Haar transform and a Hadamard transform, such that a basis of the second domain is maximally incoherent to a Haar basis.

Advantageously, and as discussed in more details below, the conversion combines a Haar transform with a Hadamard transform. Furthermore, the signal is preferably handled as an input vector (x), i.e. representing the signal in the first domain. The conversion shall then leads to an output vector (o) of the same size, e.g., $2^n$, which represents the signal in the second domain.

In particular, it can be provided that the step of converting includes applying a Haar transform combined with a Hadamard transform.

According to another embodiment, the step of providing includes providing the first representation of the signal as an input vector representing the signal in the first domain and having a size of $2^n$; and the step of converting includes converting the input vector into an output vector of the same size, and representing the signal in the second domain. This results in an improved algorithmic efficiency.

Furthermore, at the step of applying, the Haar transform and the Hadamard transform can be combined into n computational stages, where a $j^{th}$ computational stage takes outputs of a $j-1^{th}$ computational stage as input. The advantage of this method is that it can be implemented by a topology that is void of any recursive operations.

For practical implementation, the n computational stages can be each defined by one or more stage-to-stage functions, and one or more feed forward functions, where a stage-to-stage function for stage n is given by:

$$P_n = \begin{bmatrix} I_{n-1} & I_{n-1} \\ I_{n-1} & -I_{n-1} \end{bmatrix}$$

and where a feed forward function for stage n is given by:

$$Q_n = \begin{bmatrix} E_{n-1} & -E_{n-1} \\ -E_{n-1} & 3E_{n-1} \end{bmatrix},$$

with $I_n$ being a $2^n \times 2^n$ identity matrix and $E_n$ being a $2^n \times 2^n$ matrix consisting of 1's only, each of the feed forward functions and the stage-to-stage functions taking $2^n$ elements of an input vector as input.

In particular, at a first computational stage each pair of elements of an input vector can be passed to each of a first feed forward function and a first stage-to-stage function, and results of the first stage-to-stage and the first feed-forward functions can be added, leading to two elements of a first intermediate vector, whereby a plurality of such first intermediate vectors are obtained; and where at a second computational stage elements of two such first intermediate vectors can be passed to each of a second feed forward function and a second stage-to-stage function, and results of the second stage-to-stage functions and the second feed-forward functions can be added, resulting in four elements of a second intermediate vector.

The advantage of this method is that it can use a device topology built by means of a stage-to-stage wiring and a feed-forward wiring coupled with adders to achieve the computation of the transform. Apart from adding, the wiring only requires multiplication of signals by integer values −1, 1 and 3 and is well suitable for simple hardware applications.

Furthermore, the transformation of the input vector to a basis maximally incoherent with a Haar domain can be defined by:

$$M_n \begin{bmatrix} L(x) \\ H(x) \end{bmatrix} = P_n \begin{bmatrix} M_{n-1}L(x) \\ M_{n-1}H(x) \end{bmatrix} + Q_n \begin{bmatrix} L(x) \\ H(x) \end{bmatrix}$$

where L(x) corresponds to the first half of the input vector (x) and H(x) corresponds to the second half of the vector (x).

According to another aspect, a method for compressive sampling of an input signal represented as an input vector is provided using the above method for converting the input signal.

Furthermore, a device for converting a signal can be provided, where the device includes an arrangement of stages, configured for implementing n computational stages which can be each defined by implementing the above defined one or more stage-to-stage functions; and the above defined one or more feed forward functions, each of the feed forward functions and the stage-to-stage functions taking $2^n$ elements of an input vector as input.

Moreover, each of the stages can include one or more feed forward units, one or more stage-to-stage units, and one or more adder units for adding outputs of the one or more feed forward units and the one or more stage-to-stage units, where the feed forward units, the stage-to-stage units and the adder units are configured to implement the one or more feed forward functions and the one or more stage-to-stage functions.

According to a further aspect a computer readable article of manufacture tangibly embodying computer readable instructions which when executed, causes a computer to carry out the steps of a method for converting a signal including the steps of: providing a first representation of the signal in a first domain; converting the first representation of the signal into a second representation of the signal in a second domain, by applying a transform involving a Haar transform and a Hadamard transform, such that a basis of the second domain is maximally incoherent to a Haar basis.

In the block diagram of FIG. 1, an input vector $x=[x_1, \ldots, x_8]^T$ is transformed to a basis which is maximally incoherent with a Haar basis by means of several computational stages, three stages in the present example.

To describe each functionality of the blocks P/Q1, P/Q2, P/Q3 in the several stages, use is made of the following definitions:

The Haar basis of dimension n is the set of real vectors $\phi_1, \ldots, \phi_n$, where $$\phi_{2k}[i] = \begin{cases} \dfrac{1}{\sqrt{2}} & i = 2k, 2k+1 \\ 0 & \text{otherwise} \end{cases}$$

-continued $$\phi_{2k+1}[i] = \begin{cases} \frac{1}{\sqrt{2}} & i = 2k \\ -\frac{1}{\sqrt{2}} & i = 2k+1 \\ 0 & \text{otherwise} \end{cases}$$

The non-normalized Haar transform $H_n$ in natural order of a signal of length $2^n$ is expressed recursively as:

$$H_n = B_n + D_n$$

with $$D_n = \begin{bmatrix} 1 & 1 \\ 0 & 0 \end{bmatrix} \otimes D_{n-1}$$

$$B_n = \begin{bmatrix} 1 & 0 \\ 0 & 1 \end{bmatrix} \otimes B_{n-1 1} + \begin{bmatrix} 0 & 0 \\ 1 & -1 \end{bmatrix} \otimes D_{n-1}$$

$$D_o = [1], B_0 = [0]$$

The method for converting a signal is based on the following theorem:

The measurement $M_n$ basis is expressed recursively as follows:

$$M_n = P_n + Q_n$$

$$P_n = \begin{bmatrix} 1 & 1 \\ 1 & -1 \end{bmatrix} \otimes P_{n-1} + \begin{bmatrix} 1 & -1 \\ -1 & 1 \end{bmatrix} \otimes Q_{n-1}$$

$$Q_n = \begin{bmatrix} 1 & 1 \\ 1 & 1 \end{bmatrix} \otimes Q_{n-1}$$

$$Q_o = [1], P_0 = [0]$$

The measurement $M_n$ basis is perfectly incoherent with a modified Haar basis given as:

$$G_n = \frac{1}{2} \begin{bmatrix} G_{n-1} \otimes [1 \ 1] \\ I_{n-1} \otimes [1 \ -1] \end{bmatrix}, G_0 = [1]$$

This can be easily seen by the following. First, it is shown that $H_n G_n^T = I_n$ for $n = 1, 2, \ldots$, where $I_n$ corresponds to the identity matrix. It is trivial to see that this holds for $n=1$. By induction, $$H_n G_n^T = \begin{bmatrix} H_{n-1} \otimes [1 \ 1] \\ I_{n-1} \otimes [1 \ -1] \end{bmatrix} \frac{1}{2} \begin{bmatrix} G_{n-1} \otimes [1 \ 1] \\ I_{n-1} \otimes [1 \ -1] \end{bmatrix}^T$$

$$= \frac{1}{2} \begin{bmatrix} H_{n-1} \otimes [1 \ 1] \\ I_{n-1} \otimes [1 \ -1] \end{bmatrix} [G_{n-1}^T \otimes [1 \ 1]^T \ I_{n-1} \otimes [1 \ -1]^T]$$

$$= \frac{1}{2} \begin{bmatrix} H_{n-1} G_{n-1} \otimes 2 & H_{n-1} \otimes 0 \\ G_{n-1}^T \otimes 0 & I_{n-1} \otimes 2 \end{bmatrix}$$

$$= \frac{1}{2} \begin{bmatrix} 2I_{n-1} & 0 \\ 0 & 2I_{n-1} \end{bmatrix}$$

$$= I_n$$

It can further be shown that $M_n = X_n H_n$ where $X_n$ is a Hadamard matrix of order $2^n \times 2^n$. Knowing that the incoherence matrix can be written as:

$$Q := M_n G_n^T = X_n H_n G_n^T = X_n$$

As a result, by definition of the Hadamard matrix $|Q|_{ij} = 1$ for each element $(i, j)$ of Q is obtained.

FIG. 1 shows a block diagram illustrating a feed-forward fast transform algorithm or device which exploits the recursive structure presented in the above theorem. The algorithm consists of $n = \log_2 I(x)$ stages, where $I(x)$ is the size of the input vector x. The result of a third order device for an input vector x of size 8 is an output vector o.

At each stage, P/Q1 blocks are provided of an order n to transform the results of the previous stage as the input for the following stage. In case of a hardware implementation, the stages are connected to the preceding and/or succeeding stages or to other buffers by wiring.

Figure 2:
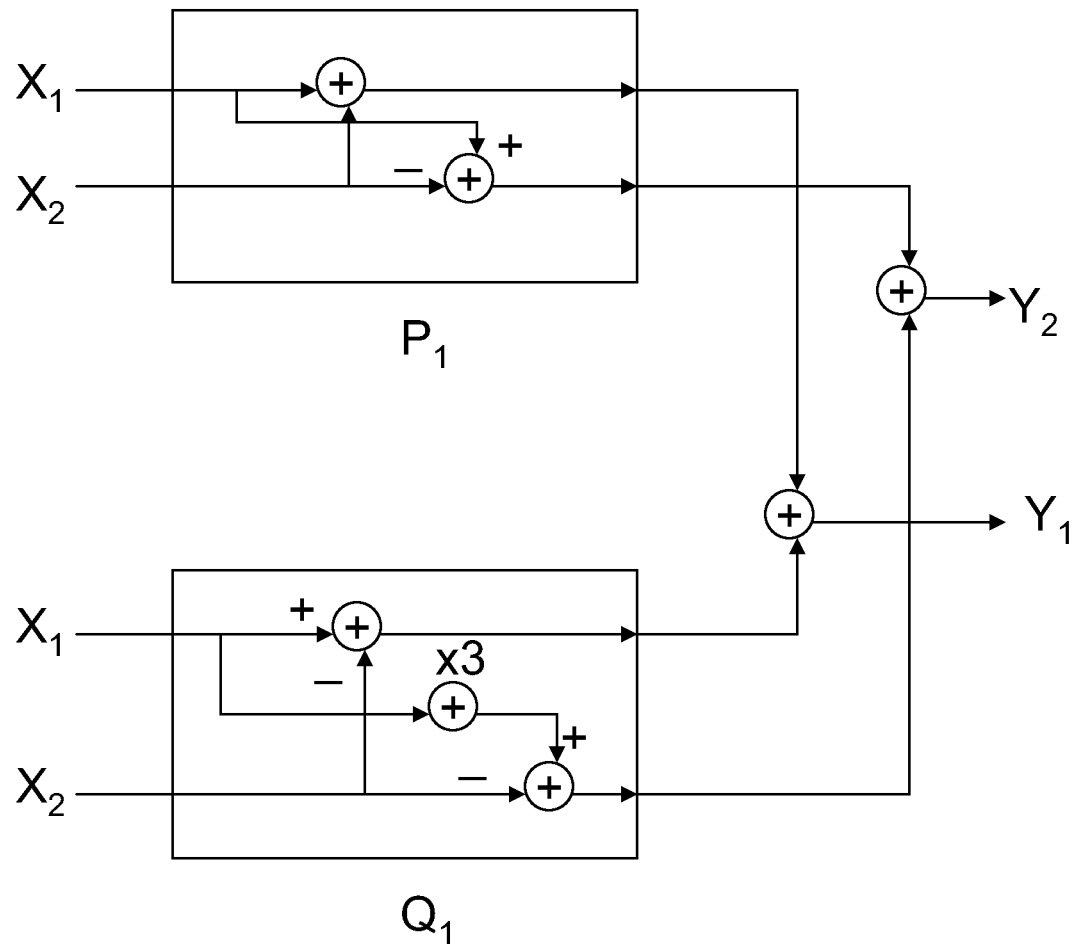
FIG. 2 shows a detailed wiring of the P/Q1 block of FIG. 1.

As an example, FIG. 2 shows the block P/Q1 for the first stage, where every two elements of the input vector x are processed according to the processing rules given above. The general design of the algorithm is based on the fact that the transform of order n can be computed using two transforms of order n−1. When L(x) and H(x) are a first and a second half of the input vector x, respectively, it follows:

$$M_n \begin{bmatrix} L(x) \\ H(x) \end{bmatrix} = \begin{bmatrix} M_{n-1} L(x) + M_{n-1} H(x) \\ M_{n-1} L(x) - M_{n-1} H(x) \end{bmatrix} + \begin{bmatrix} Q_{n-1} L(x) - Q_{n-1} H(x) \\ 3Q_{n-1} H(x) - Q_{n-1} L(x) \end{bmatrix}$$

$$= P \begin{bmatrix} M_{n-1} L(x) \\ M_{n-1} H(x) \end{bmatrix} + Q \begin{bmatrix} L(x) \\ H(x) \end{bmatrix}$$

In general, the equation can be translated into a fast algorithm using two wirings: the P wiring takes as the input the transform applied to each of the first and second half of the input vector x. The Q wiring combines the coefficients of the input vector x, where the explicit equations for the wirings are given as:

$$P = \begin{bmatrix} I_{n-1} & I_{n-1} \\ I_{n-1} & -I_{n-1} \end{bmatrix}$$

$$Q = \begin{bmatrix} E_{n-1} & -E_{n-1} \\ -E_{n-1} & 3E_{n-1} \end{bmatrix},$$

where $I_n$ is the $2^n \times 2^n$ identity matrix and $I_0 = 1$ and $E_n$ is a $2^n \times 2^n$ matrix consisting only of 1's.

Following, the function of block P/Q1 is described in detail. According to above general description, the wiring matrices for block P/Q1 are:

$$P_1 = \begin{bmatrix} 1 & 1 \\ 1 & -1 \end{bmatrix}$$

$$Q_1 = \begin{bmatrix} 1 & -1 \\ -1 & 3 \end{bmatrix}.$$

Assume the block inputs are $$\begin{bmatrix} x_1 \\ x_2 \end{bmatrix}$$

and outputs are $$\begin{bmatrix} y_1 \\ y_2 \end{bmatrix},$$

where $x_1, x_2$ are the elements of the input vector and $y_1, y_2$ are the elements of the output vector of the first stage.

then $P_1 \begin{bmatrix} x_1 \\ x_2 \end{bmatrix} = \begin{bmatrix} 1 & 1 \\ 1 & -1 \end{bmatrix} \begin{bmatrix} x_1 \\ x_2 \end{bmatrix} = \begin{bmatrix} x_1 + x_2 \\ x_1 - x_2 \end{bmatrix}$ $$Q_1 \begin{bmatrix} x_1 \\ x_2 \end{bmatrix} = \begin{bmatrix} 1 & -1 \\ -1 & 3 \end{bmatrix} \begin{bmatrix} x_1 \\ x_2 \end{bmatrix} = \begin{bmatrix} x_1 - x_2 \\ -x_1 + 3x_2 \end{bmatrix},$$

where P is the stage-to-stage wiring between $P_{n-1}$ and $P_n$ and Q is the feed-forward wiring. The combination is $$\begin{bmatrix} y_1 \\ y_2 \end{bmatrix} = P_1 \begin{bmatrix} x_1 \\ x_2 \end{bmatrix} + Q_1 \begin{bmatrix} x_1 \\ x_2 \end{bmatrix} = \begin{bmatrix} x_1 + x_2 \\ x_1 - x_2 \end{bmatrix} + \begin{bmatrix} x_1 - x_2 \\ -x_1 + 3x_2 \end{bmatrix} = \begin{bmatrix} 2x_1 \\ 2x_2 \end{bmatrix}$$

This relationship is shown in FIG. 2 having a P1 block with one adder and one subtraction element and a Q1 block having two subtraction elements and one multiplication element. The results are added by the further adders which are also shown in FIG. 1 after each P/Q block.

According to above formula, the block P/Q2 has wiring matrices $P_2$ and $Q_2$.

$$P_2 = \begin{bmatrix} 1 & 0 & 1 & 0 \\ 0 & 1 & 0 & 1 \\ 1 & 0 & -1 & 0 \\ 0 & 1 & 0 & -1 \end{bmatrix}$$

$$Q_2 = \begin{bmatrix} 1 & 1 & -1 & -1 \\ 1 & 1 & -1 & -1 \\ -1 & -1 & 3 & 3 \\ -1 & -1 & 3 & 3 \end{bmatrix}$$

The input is now $(y_1, y_2, y_3, y_4)^T$, which is the result of the previous stage for the P matrix wiring and $(x_1, x_2, x_3, x_4)^T$ which is the input vector x of the algorithm.

Then it follows:

$$P_2 \begin{bmatrix} y_1 \\ y_2 \\ y_3 \\ y_4 \end{bmatrix} = \begin{bmatrix} y_1 + y_3 \\ y_2 + y_4 \\ y_1 - y_3 \\ y_2 - y_4 \end{bmatrix}$$

$$Q_2 \begin{bmatrix} x_1 \\ x_2 \\ x_3 \\ x_4 \end{bmatrix} = \begin{bmatrix} x_1 + x_2 - x_3 - x_4 \\ x_1 + x_2 - x_3 - x_4 \\ -x_1 - x_2 + 3x_3 + 3x_4 \\ -x_1 - x_2 + 3x_3 + 3x_4 \end{bmatrix}$$

The output of the P/Q2 stage is then:

$$\begin{bmatrix} z_1 \\ z_2 \\ z_3 \\ z_4 \end{bmatrix} = \begin{bmatrix} y_1 + y_3 + x_1 + x_2 - x_3 - x_4 \\ y_2 + y_4 + x_1 + x_2 - x_3 - x_4 \\ y_1 - y_3 - x_1 - x_2 + 3x_3 + 3x_4 \\ y_2 - y_4 - x_1 - x_2 + 3x_3 + 3x_4 \end{bmatrix}$$

Figure 3:
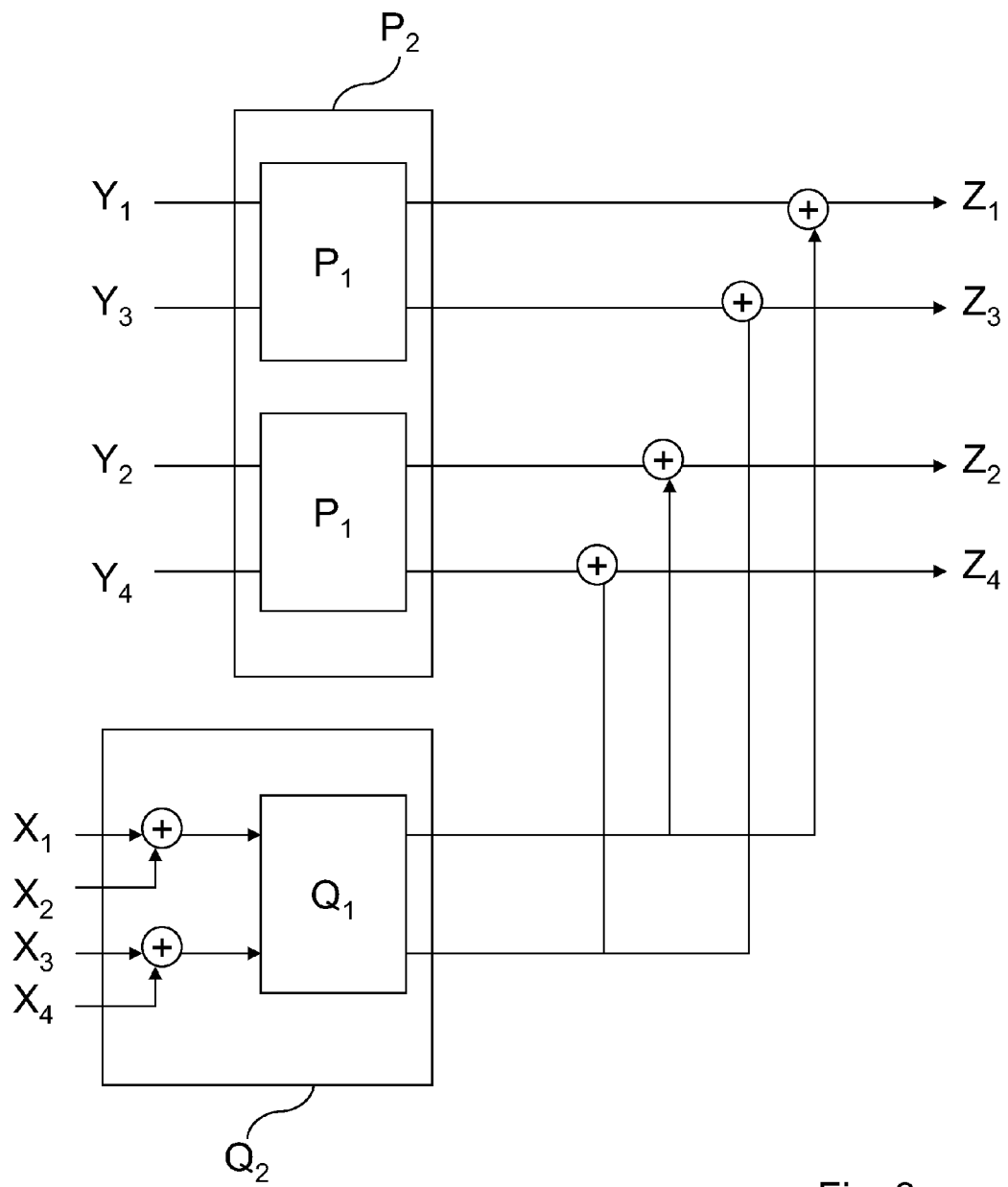
FIG. 3 shows a detailed wiring of the P/Q2 block of FIG. 1.
Figure 4:
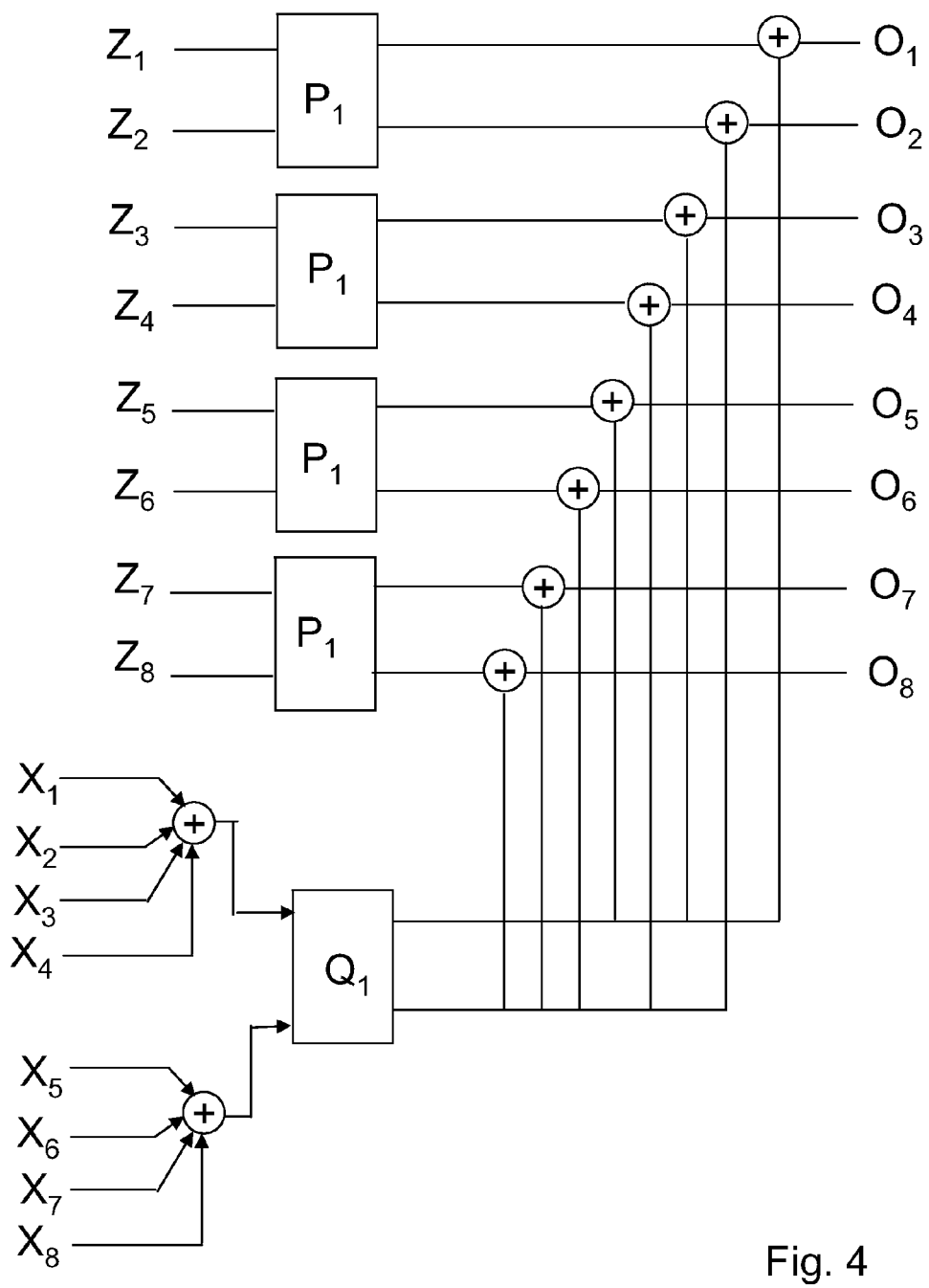
FIG. 4 shows a detailed wiring of the P/Q3 block of FIG. 1.

The P/Q2 block for signals $y_1, \ldots, y_4$ and $x_1, \ldots, x_4$ is illustrated in FIG. 3 and a P/Q3 block for $z_1, \ldots, z_4$ and $x_1, \ldots, x_4$ is illustrated in FIG. 4.

Block P/Q3 is defined as follows:

$$\begin{bmatrix} o_1 \\ o_2 \\ o_3 \\ o_4 \\ o_5 \\ o_6 \\ o_7 \\ o_8 \end{bmatrix} = \begin{bmatrix} z_1 + z_3 + x_1 + x_2 + x_3 + x_4 - x_5 - x_6 - x_7 - x_8 \\ z_2 + z_4 + x_1 + x_2 + x_3 + x_4 - x_5 - x_6 - x_7 - x_8 \\ z_1 - z_3 - x_1 - x_2 - x_3 - x_4 + 3x_5 + 3x_6 + 3x_7 + 3x_8 \\ z_2 - z_4 - x_1 - x_2 - x_3 - x_4 + 3x_5 + 3x_6 + 3x_7 + 3x_8 \\ z_5 + z_7 + x_1 + x_2 + x_3 + x_4 - x_5 - x_6 - x_7 - x_8 \\ z_6 + z_8 + x_1 + x_2 + x_3 + x_4 - x_5 - x_6 - x_7 - x_8 \\ z_5 - z_7 - x_1 - x_2 - x_3 - x_4 + 3x_5 + 3x_6 + 3x_7 + 3x_8 \\ z_6 - z_8 - x_1 - x_2 - x_3 - x_4 + 3x_5 + 3x_6 + 3x_7 + 3x_8 \end{bmatrix}$$

The respective design of the P/Q3 block as a combination of adders and blocks P1 and Q1 can be seen in FIG. 4.

The block diagram of FIG. 1 illustrates the fast algorithm for performing the transformation without detailed schematics of the wiring.

Above transform can be used for compressive sampling which has a multitude of application areas. While compressive sampling is known to be applicable for imaging applications, such as for MRI and general camera sensor devices, it can also be used for processing data handled in a streaming fashion, such as data in financial markets, e.g. storage and analysis of stock and FX rates.

Furthermore, compressive sampling can be used for efficient gathering of performance information in a multicore system. Modern processors contain multiple interacting parts making predicting the actual average clock cycles per instruction for the execution of a particular piece of code difficult to achieve. For example, a set of instruction that modify data with weak locality will be constantly forced to flush their cache. The expected performance on the exact same hardware of the exact same sets of instruction on strongly localized data will be much better. This has led to the introduction of an additional unit to the processor which is called performance monitor unit (PMU) that samples the performance of the rest of the processor. Modern PMU contain hundreds of counters for indicating bus usage, cache misses page faults, branch misses etc. as well as complex logic for determining which of the many pipelined instructions and predicted branches actually cause the counter to be increased. A current generation processor will contain many processors interconnected across the bus and in which each processor contains many cores.

A simple example of how compressive sampling can be used for performance monitoring, where the CPI of a processor represents the average number of cycles over some time period required to execute an instruction. Although the actual CPI is discrete, the rate at which it changes is so much faster than any realistic sampling period that it can be considered as a continuous function of time.

While the present invention has been described with reference to certain embodiments, it will be understood by those skilled in the art that various changes can be made and equivalents can be substituted without departing from the scope of the present invention. In addition, many modifications can be made to adapt a particular situation to the teachings of the present invention without departing from its scope. Therefore, it is intended that the present invention not be limited to the particular embodiment disclosed, but that the present invention will include all embodiments falling within the scope of the appended claims. For example, the present invention can be contemplated for various applications, extending beyond compressive sampling. While embodiments described above merely rely on n computational stages using stage-to-stage functions and feed forward functions (or corresponding units), it can be realized that other functional arrangement can be contemplated, e.g., such that a $j^{th}$ computational stage takes outputs of a $j-1^{th}$ computational stage as input. In a variant, a brute force method can be applied, involving a single transform only. More generally, alternative conversions can be contemplated which includes applying combined Haar and Hadamard transforms, or even, interlaced such that a single transform is involved. Also, in a hardware device, one can possibly optimize the number of adders, e.g., blocks P1 and Q1 can share the same adders which add the results of P1 and Q1 together, in contrast with the exemplary embodiments discussed above. In other words, it does not matter whether the addition is performed locally in P1 and Q1 and then P1 and Q1 are added, or there are only two adders, which are used both in P1 and Q1. What implementation is the best can depend on the underlying hardware possibilities.

The invention claimed is:

1. A method for converting a signal, comprising steps of:
   applying, by a processor device, a transform including a Haar transform and a Hadamard transform to a first representation of the signal in a first domain; and
   converting, by a processor device, said first representation of the signal into a second representation of the signal in a second domain such that a basis of the second domain is maximally incoherent to a Haar basis;
   wherein the Haar transform and the Hadamard transform are combined into n computational stages (P/Q1, P/Q2, P/Q3), wherein the $j^{th}$ computational stage takes outputs of a $j-1^{th}$ computational stage as input; and
   wherein the n computational stages (P/Q1, P/Q2, P/Q3) are each defined by: one or more stage-to-stage functions (P1, P2, P3); and one or more feed forward functions (Q1, Q2, Q3), wherein a stage-to-stage function for stage n is given by:

$$P_n = \begin{bmatrix} I_{n-1} & I_{n-1} \\ I_{n-1} & -I_{n-1} \end{bmatrix}$$

and wherein a feed forward function for stage n is given by:

$$Q_n = \begin{bmatrix} E_{n-1} & -E_{n-1} \\ -E_{n-1} & 3E_{n-1} \end{bmatrix},$$

with $I_n$ being a $2^n \times 2^n$ identity matrix and $E_n$ being a $2^n \times 2^n$ matrix consisting of 1's only, each of the feed forward functions and the stage-to-stage functions taking $2^n$ elements of an input vector as input.

2. The method according to claim 1, wherein the step of converting comprises applying a Haar transform combined with a Hadamard transform.

3. The method according to claim 2, wherein:
   said first representation of the signal as an input vector (x) represents the signal in the first domain and has a size of $2^n$; and
   the input vector (x) is converted into an output vector (o) of the same size, and represents the signal in the second domain.

4. The method according to claim 3,
   wherein at a first computational stage: each pair of elements of an input vector is passed to each of a first feed forward function (Q1) and a first stage-to-stage function (P1), and results of the first stage-to-stage (P1) and the first feed-forward functions (Q1) are added, leading to two elements of a first intermediate vector, whereby a plurality of such first intermediate vectors are obtained; and
   wherein at a second computational stage: elements of two such first intermediate vectors are passed to each of a second feed forward function (Q2) and a second stage-to-stage function (P2), and results of the second stage-to-stage functions (P2) and the second feed-forward functions (Q1) are added, resulting in four elements of a second intermediate vector.

5. The method according to claim 3, wherein the transformation of the input vector x to a basis maximally incoherent with a Haar domain is defined by:

$$M_n \begin{bmatrix} L(x) \\ H(x) \end{bmatrix} = P_n \begin{bmatrix} M_{n-1}L(x) \\ M_{n-1}H(x) \end{bmatrix} + Q_n \begin{bmatrix} L(x) \\ H(x) \end{bmatrix}$$

wherein L(x) corresponds to the first half of the input vector (x) and H(x) corresponds to the second half of the vector (x).

6. The method for compressive sampling of an input signal represented as an input vector (x) using the method according to claim 1.

7. The method according to claim 1, wherein each of the computational stages comprises:
   one or more feed forward units (Q1, Q2, Q3);
   one or more stage-to-stage units (P1, P2, P3); and
   one or more adder units for adding outputs of the one or more feed forward units (Q1, Q2, Q3) and the one or more stage-to-stage units (P1, P2, P3), wherein the feed forward units, the stage-to-stage units and the adder units are configured to implement the one or more feed forward functions and the one or more stage-to-stage functions.

8. A non-transitory computer readable article of manufacture tangibly embodying computer readable instructions which when executed causes a computer to carry out the steps of a method for converting a signal, comprising steps of:
   applying a transform including a Haar transform and a Hadamard transform to a first representation of the signal in a first domain; and
   converting said first representation of the signal into a second representation of the signal in a second domain such that a basis of the second domain is maximally incoherent to a Haar basis;
   wherein at the step of applying, the Haar transform and the Hadamard transform are combined into n computational stages (P/Q1, P/Q2, P/Q3), wherein the $j^{th}$ computational stage takes outputs of a $j-1^{th}$ computational stage as input; and
   wherein the n computational stages (P/Q1, P/Q2, P/Q3) are each defined by: one or more stage-to-stage functions (P1, P2, P3); and one or more feed forward functions (Q1, Q2, Q3), wherein a stage-to-stage function for stage n is given by:

$$P_n = \begin{bmatrix} I_{n-1} & I_{n-1} \\ I_{n-1} & -I_{n-1} \end{bmatrix}$$

and wherein a feed forward function for stage n is given by:

$$Q_n = \begin{bmatrix} E_{n-1} & -E_{n-1} \\ -E_{n-1} & 3E_{n-1} \end{bmatrix},$$

with $I_n$ being a $2^n \times 2^n$ identity matrix and $E_n$ being a $2^n \times 2^n$ matrix consisting of 1's only, each of the feed forward functions and the stage-to-stage functions taking $2^n$ elements of an input vector as input.

* * * * *